US012206033B2

(12) United States Patent
Aifer et al.

(10) Patent No.: US 12,206,033 B2
(45) Date of Patent: Jan. 21, 2025

(54) METHODS AND APPARATUSES FOR IMPROVED BARRIER AND CONTACT LAYERS IN INFRARED DETECTORS

(71) Applicant: The Government of the United States, as represented by the Secretary of the Navy, Arlington, VA (US)

(72) Inventors: Edward H. Aifer, Arlington, VA (US); Jerry R. Meyer, Catonsville, MD (US); Chadwick Lawrence Canedy, Washington, DC (US); Igor Vurgaftman, Severna Park, MD (US); Jill A. Nolde, Takoma Park, MD (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 0 days.

(21) Appl. No.: 17/879,440

(22) Filed: Aug. 2, 2022

(65) Prior Publication Data

US 2023/0178667 A1 Jun. 8, 2023

Related U.S. Application Data

(63) Continuation of application No. 16/525,160, filed on Jul. 29, 2019, now Pat. No. 11,404,591.
(Continued)

(51) Int. Cl.
*H01L 31/0352* (2006.01)
*H01L 31/0304* (2006.01)
(Continued)

(52) U.S. Cl.
CPC ............... *H01L 31/035236* (2013.01); *H01L 31/03046* (2013.01); *H01L 31/109* (2013.01); *H01L 31/1844* (2013.01)

(58) Field of Classification Search
CPC ... H01L 31/035236–035263; H01L 31/03046; H01L 31/109; H01L 31/1844
See application file for complete search history.

(56) References Cited

U.S. PATENT DOCUMENTS 11,404,591 B2 * 8/2022 Aifer ................. H01L 31/03046
2012/0145996 A1 * 6/2012 Ting ..................... H01L 31/1852
257/E29.022

(Continued)

*Primary Examiner* — Suberr L Chi
(74) *Attorney, Agent, or Firm* — US Naval Research Laboratory

(57) ABSTRACT

An infrared detector and a method for forming it are provided. The detector includes absorber, barrier, and contact regions. The absorber region includes a first semiconductor material, with a first lattice constant, that produces charge carriers in response to infrared light. The barrier region is disposed on the absorber region and comprises a superlatice that includes (i) first barrier region layers comprising the first semiconductor material, and (ii) second barrier region layers comprising a second semiconductor material, different from, but lattice matched to, the first semiconductor material. The first and second barrier region layers are alternatingly arranged. The contact region is disposed on the barrier region and comprises a superlattice that includes (i) first contact region layers comprising the first semiconductor material, and (ii) second contact region layers comprising the second semiconductor material layer. The first and second contact region layers are alternatingly arranged.

20 Claims, 13 Drawing Sheets

Related U.S. Application Data

(60) Provisional application No. 62/711,019, filed on Jul. 27, 2018.

(51) Int. Cl.
*H01L 31/109* (2006.01)
*H01L 31/18* (2006.01)

(56) References Cited

U.S. PATENT DOCUMENTS

2014/0225064 A1* 8/2014 Khoshakhlagh ............................ H01L 31/03046 438/94
2019/0013427 A1* 1/2019 Ting ..................... H01L 31/101

* cited by examiner

METHODS AND APPARATUSES FOR IMPROVED BARRIER AND CONTACT LAYERS IN INFRARED DETECTORS

BACKGROUND

Field of the Invention

The present application relates generally to infrared detectors.

Description of Related Art

Infrared detectors are used in a variety of commercial and scientific applications. One type of infrared detector is based on interband absorption between the conduction and valence bands of a semiconductor. This process results in the creation of an electron/hole pair in the material. To detect light within a desired wavelength range, however, it is necessary to select a material that has an energy gap smaller than the photon energy corresponding to that wavelength. Two spectral regions or "bands" of the infrared spectrum of particular interest are the mid-wavelength infrared (MWIR) and the long-wavelength infrared (LWIR) bands, which fall within atmospheric transmission windows between 3 to 5 µm and 8 to 14 µm respectively. The human body and other objects in ambient emit peak blackbody emission within the LWIR band, and also significant emission in the MWIR. Other common objects such as automobiles and planes, with much hotter components can have peak emission in the MWIR band.

One type of detector is an XBn detector. The X, B, and n refer to different regions of the detector. The "n" region is a region composed of a semiconductor in which a concentration of impurity atoms have been introduced or "doped" into the semiconducting material such that they ionize positively by liberating typically 1 electron per atom at well below operating temperature, resulting in a similar concentration of electrons in the conduction band, and is often referred to as an n-type region. Despite the additional concentration of electrons, under equilibrium conditions the n-region remains electrically neutral due to the presence of the positively ionized impurities. The "B" region is a barrier region designed to block the migration of certain charge carriers. The "X" region is a contact region that may be either an n-type region or a p-type region. A "p" region is a region in which the semiconductor has been doped with a concentration of different type of impurity atom that negatively ionizes by attaching typically 1 electron per atom at well below operating temperature, resulting in a similar concentration of holes in the valence band, and is often referred to as a p-type region. Despite the additional concentration of holes, under equilibrium conditions the p-region also remains electrically neutral due to the presence of the negatively ionized impurities.

An energy band diagram of the basic nBn detector structure 100 is shown in FIG. 1A. As shown in FIG. 1A, an electron blocking barrier 104 is interposed between a thin top n+ contact region 102 and a thick, low-n-doped IR absorbing region 106 disposed on an n+ contact region 108. The barrier 104 has much wider bandgap than the absorber 106 and contact regions 102 and 108, with all of the difference appearing in the conduction band offset. IR light 118 enters the absorber region 106 through contact region 108.

FIG. 1B illustrates the operation of structure 100 when a bias 115 is applied to overcome the potential difference across the barrier 104 due to the heavier doping in the n+ contact. An electron 110 and a hole 112 created by a photogeneration event 109 diffuse towards contacts 107-B and 107-A, respectively. Barrier region 104 performs a similar role as a p-n junction in preventing majority electrons generated in contact region 102 from flowing to contact 107-B to maintain low dark current. Barrier region 104 allows, however, photogenerated electron-hole pairs 110, 112 in the absorber region 106 to produce rectified photocurrent with electrons recombining at the "+" electrode 107-B and minority holes recombining at the "−" electrode 107-A on the other side of the barrier 104.

One limitation of the basic nBn structure of FIG. 1A, however, is the optical loss due to absorption in the n-type contact regions 102 and 108. Contact regions 102 and 108 are often highly doped, which typically results in very short minority carrier lifetime due to the high density of impurities which often create efficient recombination centers. Thus, for IR light 118 incident through the "bottom" contact region 108, photoexcited carriers generated there tend to recombine before they can contribute to photocurrent. Optical losses in contact region 102 might seem to be insignificant because it is on the opposite side of the absorber with respect to the IR radiation incidence. This however is not that case, as one typically disposes a fully reflecting metal contact metallization 107-A over the top of contact region 102. Then IR radiation that passes through the absorber region 106, the barrier region 104 and contact region 102, and is reflected back by electrode 107-A through contact region 102, barrier region 104 and the absorber region 106 for a second pass, so that losses in contact region 102 are often doubled. Any photo-generation that may occur in contact region 102, however, cannot contribute photocurrent since electron 110 is blocked from reaching contact 107-B by the barrier region 104, as shown in FIG. 1C. This is in addition to a similar loss mechanism in contact region 108 due to reduced minority carrier lifetime, though is generally not as pronounced since this contact is typically much thinner because it supports the current density from only one device rather than serving as a the common electrode for many devices in an imaging array as bottom contact 108.

Another problem with many nBn structures is the presence of a large potential barrier to holes generated in an absorber region, as illustrated in FIG. 2A. FIG. 2A shows a band diagram for another nBn structure 200 that includes a contact region 202, a barrier region 204, an absorber region 206, and another contact region 208. As shown in FIG. 2A, there is a barrier 215 caused by differences in valence band energy position at equilibrium (0 Volt bias) between regions 202 and 206 that would block the migration of a hole from absorber region 206 to contact region 202. Thus, to prevent the formation of potential barrier 215, it is necessary that the top contact layer 202 be doped such that it is a p-type region, as shown in FIG. 2B.

FIG. 2B illustrates a hypothetical ideal pBn structure 300. Structure 300 includes a p-type contact region 202, a barrier region 204, an absorber region 206, and another contact region 208. Also included are contacts 207-A and 207-B which may be biased to attract holes 212 and electrons 210, respectively, created during a photogeneration event 209. In FIG. 2B, hole 212 does not face a barrier 215 (shown in FIG. 2A) and may migrate to contact 207-A.

However, there is a problem in realizing the ideal pBn device structure 300 of FIG. 2B. It is difficult—if not impossible—to find materials for the contact region 202 and barrier region 204 with the necessary bandgaps, band alignments, and lattice constants. This is particularly so for devices using bulk InAsSb absorbers, whose valence band position is considerably lower than that of typical ternary and quaternary bulk alloys, and prior art superlattices of suitable bandgap.

Thus, it would be beneficial to have detector structures that resolve at least some of the problems discussed above.

SUMMARY OF THE INVENTION

One or more the above limitations may be diminished by structures and methods described herein.

In one embodiment, an infrared detector is provided. The detector includes absorber, barrier, and contact regions. The absorber region comprises a first semiconductor material with a first lattice constant. The first semiconductor material produces charge carriers in response to infrared light. The barrier region is disposed on the absorber region. The barrier region is a superlattice comprising: (i) a plurality of first barrier region layers comprising the first semiconductor material, and (ii) a plurality of second barrier region layers comprising a second semiconductor material that is different from the first semiconductor. The plurality of first barrier region layers are alternatingly arranged with the plurality of second barrier region layers. The contact region is disposed on the barrier region. The contact region is another superlattice comprising: (i) a plurality of first contact region layers comprising the first semiconductor material, and (ii) a plurality of second contact region layers comprising the second semiconductor material layer. The plurality of first contact region layers are alternatingly arranged with the plurality of second contact region layers, In another embodiment, a method of forming an infrared detector is provided. An absorber region that comprises a first semiconductor material with a first lattice constant is formed on a substrate. The first semiconductor material produces charge carriers in response to infrared light. A barrier region is formed on the absorber region. The barrier region is a superlattice comprising: (i) a plurality of first barrier region layers comprising the first semiconductor material, and (ii) a plurality of second barrier region layers comprising a second semiconductor material that is different from the first semiconductor. The plurality of first barrier region layers are alternatingly arranged with the plurality of second barrier region layers. The contact region is formed on the barrier region. The contact region is another superlattice comprising: (i) a plurality of first contact region layers comprising the first semiconductor material, and (ii) a plurality of second contact region layers comprising the second semiconductor material layer. The plurality of first contact region layers are alternatingly arranged with the plurality of second contact region layers. The second semiconductor material is lattice matched to the first semiconductor material.

BRIEF DESCRIPTION OF THE DRAWINGS

The teachings claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

Figure 1A:
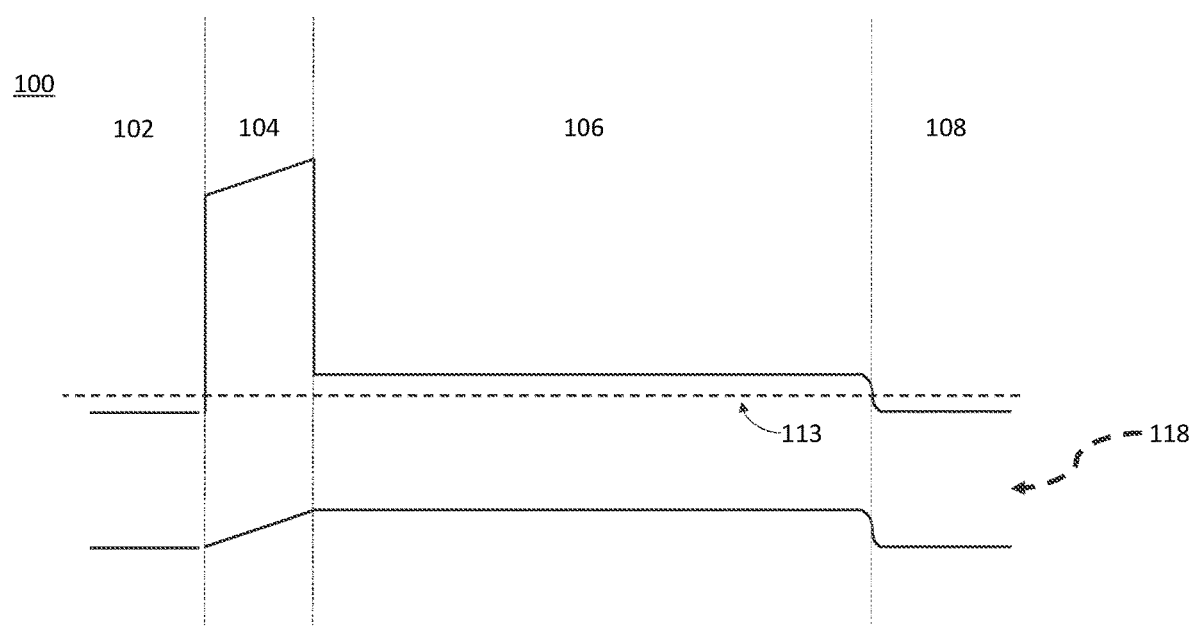
FIGS. 1A-1C are band diagrams of an ideal nBn infrared detector.
Figure 1B:
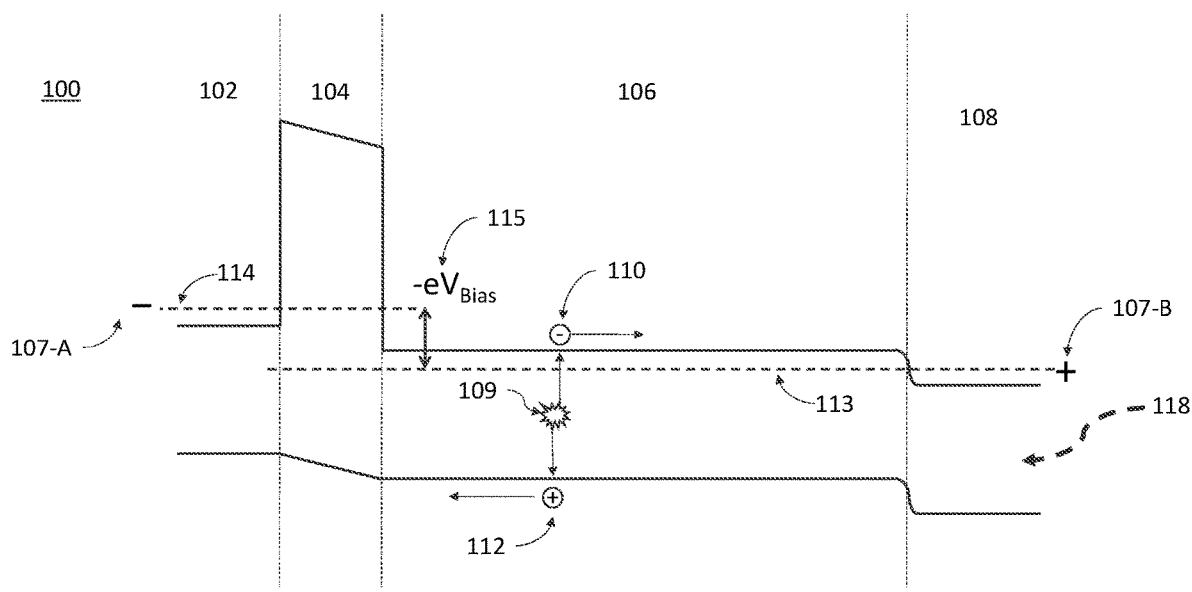
Figure 1C:
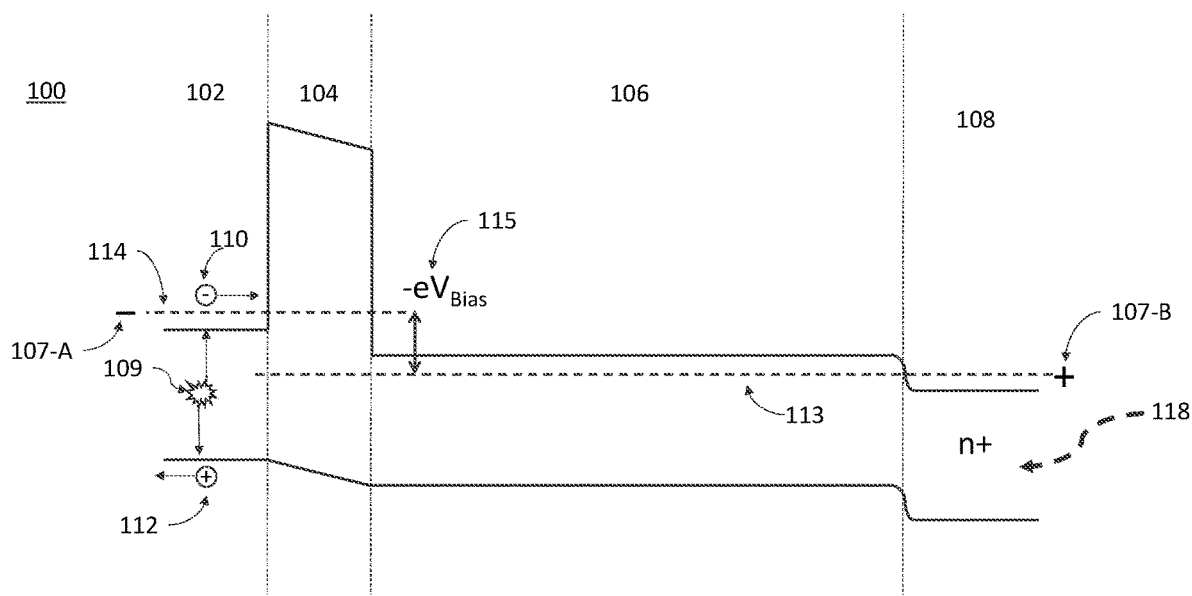
Figure 2A:
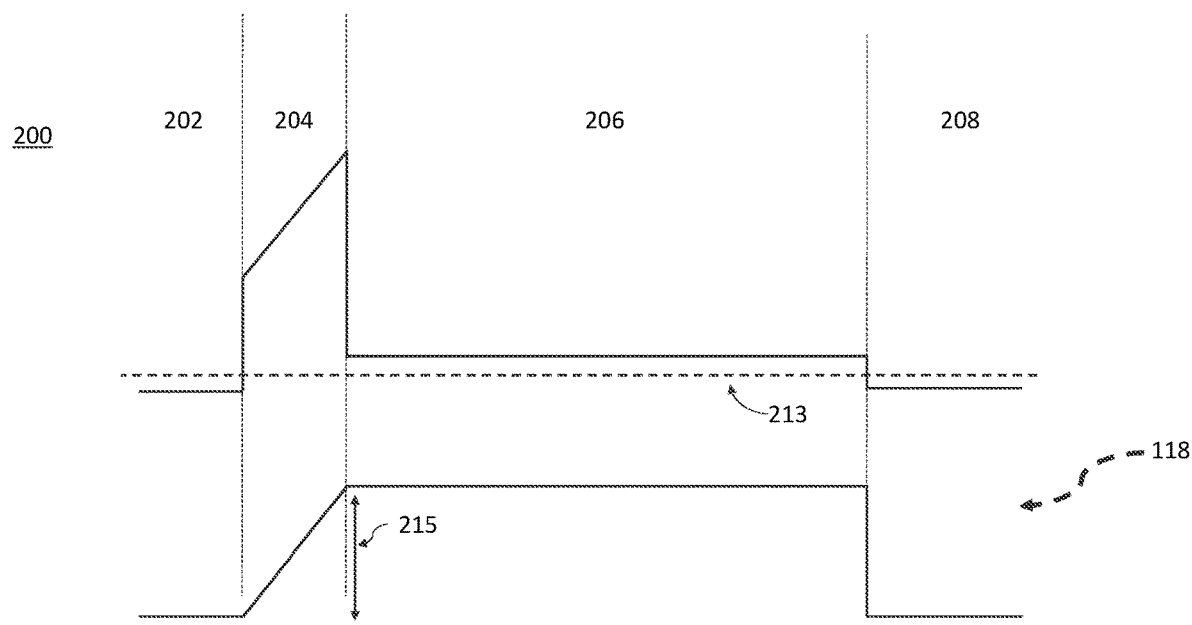
FIGS. 2A-B are band diagrams of an nBn infrared detector and a pBn infrared detector, respectively.
Figure 2B:
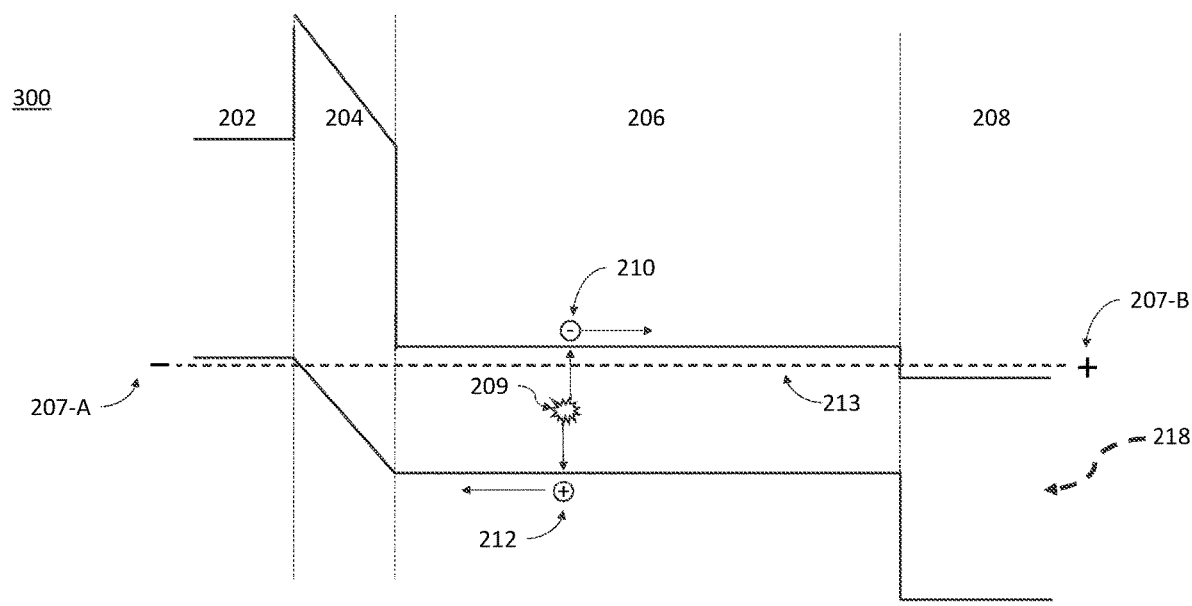

Different ones of the Figures may have at least some reference numerals that are the same in order to identify the same components, although a detailed description of each such component may not be provided below with respect to each Figure.

DETAILED DESCRIPTION OF THE PREFERRED EMBODIMENTS

In accordance with example aspects described herein are infrared detectors.

FIGS. 3A-D illustrate an exemplary infrared detector structure 300 according to one embodiment. A contact region 308 is disposed on a substrate 320, which in one embodiment comprises GaSb. Contact region 308 is constructed to receive a positive bias so as to collect electrons generated in the absorber region 306. In one embodiment, absorber region 306 is disposed on a distal side of contact region 308 with respect to substrate 320. An electron barrier region 304 is disposed on a side of the absorber region 306 that is distal with respect to substrate 320, and is constructed to block electrons that would otherwise flow in either direction across the device, but not to impede the flow of holes coming from the absorber region 306. Disposed on a side of the electron barrier region 304 that is again distal with respect to the substrate 320 is another contact region 302. Contact region 302 is constructed to receive a negative bias in order to collect holes generated in the absorber region 306. Subsequent to the disposition of these layers, individual IR sensing devices are defined by standard semiconductor masking and etching procedures to remove material down to the "bottom" contact layer 308 in regions laterally proximal to the desired sensing area. This is followed by standard semiconductor cleaning, masking, and deposition procedures to dispose Ohmic contact metallization as shown for metal electrodes 307-A and 307-B respectively. In one embodiment, the Ohmic contact metallization is comprised of vacuum deposited titanium and gold for both electrodes. The details of contact regions 308 and 302, the electron barrier region 304, and the absorber region 306 are discussed in detail below.

In one preferred embodiment, contact region 302 and contact region 308 comprise superlattices. Superlattices comprise two or more layers of binary, ternary, and quaternary alloys that are repeated to form a periodic structure. A superlattice may be used to achieve a particular direct band-gap with a lattice constant and lattice structure compatible with growth on commercially available substrates. For exemplars grown on GaSb substrates, the individual superlattice layers are III-V alloys with face-centered cubic (FCC) crystalline structure. In order to be compatible with high quality growth, the average lattice constant of each superlattice period must be closely matched to that of the underlying substrate, otherwise, crystal defects known as dislocations will form to relieve the strain and degrade the superlattice properties. When each superlattice period is comprised of sufficiently thin layers, typically 1 to approximately 70 monolayers (over 200 angstroms), the semiconducting properties become markedly different than that of the individual bulk alloys due to quantum effects that become significant on these length scales. This includes effects such as modified band gap, conduction and valence band alignments, and carrier effective mass. The alloy layers making up the superlattice period structure typically function as carrier "well" and "superlattice barrier" (SLG) layers. These single-material SLB layers within the superlattice are distinct and play a very different role from the detector barriers formed by layers 104 and 204 that block majority carrier flow between the different regions of the nBn or pBn detector. In a type-I superlattice, electrons and holes reside in common wells, confined by wider bandgap SLB layers alternating on either side. In "type-II" superlattices (T2SLs) each layer serves as both a well for one carrier and an SLB in the other, which can occur if the bandgaps of the individual layers do not align. So for example in a GaSb/InAs T2SL, which has "broken" type-II alignment, the InAs conduction band edge is about 200 meV lower than the valence band-edge of GaSb Returning to FIG. 3A, contact regions 302 and 308 may comprise a superlattice. In addition, in a preferred embodiment, barrier region 304 also comprises a superlattice. The semiconductor layers used to construct the superlattices for contact region 302, contact region 308, and barrier region 304 are each lattice matched to the material used in absorber region 306. That is the lattice constant of all material used in contact region 302, barrier region 304, and contact region 308 is substantially the same as that of the material used in the absorber region 306. To achieve this, in a preferred embodiment, the materials used in contact region 302, barrier region 304, and contact region 308, are absorber layer matched type-II superlattices (ALM-T2SLs). The thicknesses of the individual layers can be controlled to provide the superlattice with certain properties, namely particular energy levels for the conduction and valence bands. In that regard, attention will now be directed to the layers used to form contact region 302, barrier region 304, and contact region 308.

Figures 3A, 3B, 3C, 3D:
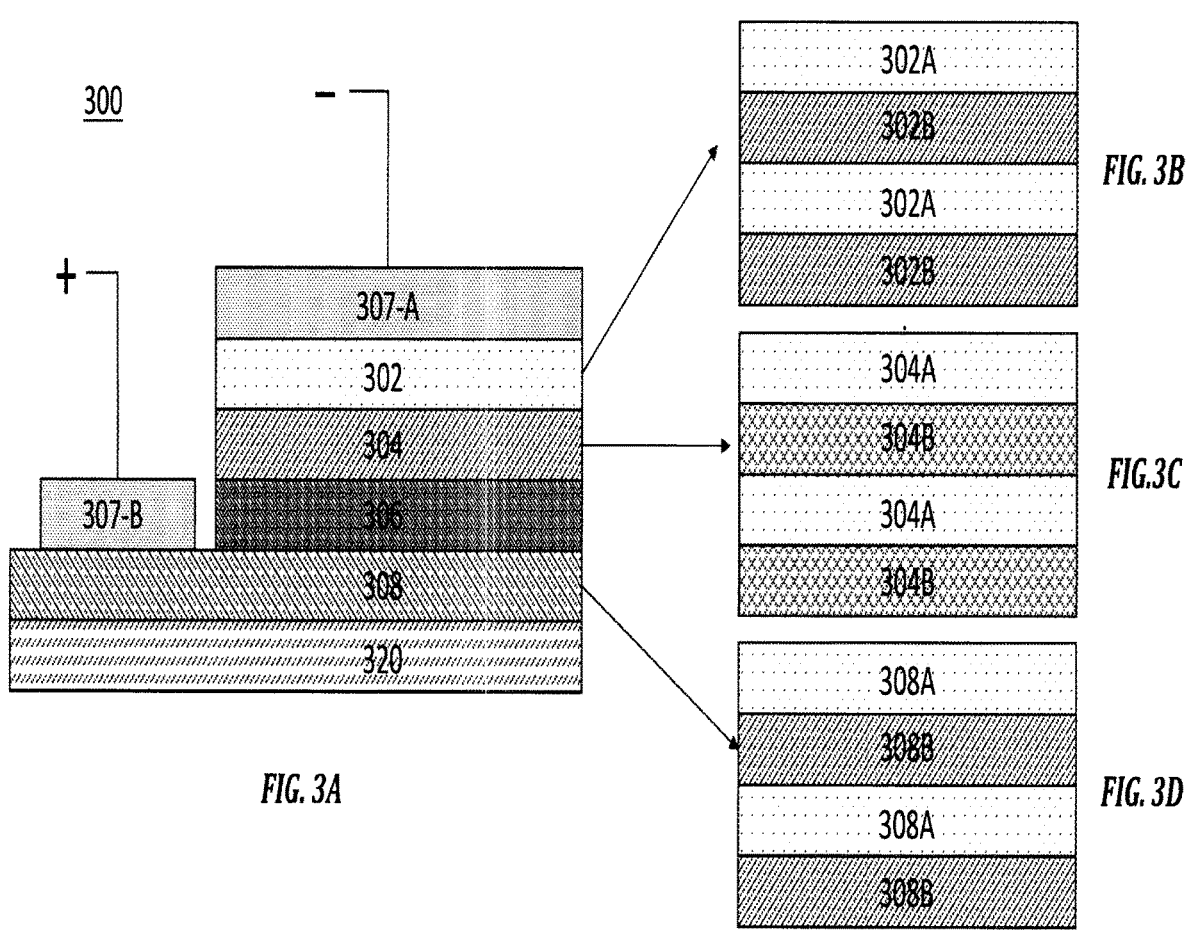
FIGS. 3A-D are cross-sectional views of a detector 300 according to one embodiment.

Turning first to the barrier region 304, barrier region 304 comprises a plurality of first barrier region layers 304A alternatingly arranged with a plurality of second barrier region layers 304B, as illustrated in FIG. 3C. The first barrier region layer 304A functions as an electron-well (e-well) and hole-SLB (h-SLB) and in the preferred embodiment, comprises the same material that forms the absorber region 306, as discussed in further detail below. The second barrier region layer 304B functions as a hole-well (h-well) and electron-SLB (e-SLB) and may comprise materials that are different from the material used in absorber region 306. Because both layers 304A and 304B are lattice matched to the substrate, any combination of thicknesses of these layers may be used to optimize barrier properties without increasing strain. This is achieved by maximizing the barrier region 304 conduction band offset with respect to the absorber region 306. One way of doing so is by using a thin e-well layer 304A, and sufficiently thick e-SLB layer 304B. This arrangement helps to block electrons generated in absorber region 306 from migrating towards contact region 302 while not impeding the migration of holes from absorber region 306 to contact region 302. While FIG. 3C shows layer 304B disposed proximate to absorber region 306, this is merely exemplary. One of ordinary skill will appreciate that layer 304A could be disposed proximate to absorber region 306 as well.

In one embodiment, contact regions 302 and 308 use the same ALM-T2SL structure, though with different doping and overall region thicknesses. Of course, that arrangement is merely exemplary. Contact regions 302 and 308 may have different ALM-T2SL structures. Like barrier region 304, contact region 302 comprises first contact region layers 302A alternatingly arranged with second contact region layers 302B, as illustrated in FIG. 3B. Like in barrier region 304, the first contact region layers 302A function as e-wells and h-SLBs, while the second contact region layers 302B function as h-wells and e-SLBs. Like with layer 304A, layer 302A, in a preferred embodiment, comprises the same alloy that forms the absorber region 306, as discussed in further detail below. In a preferred embodiment, layer 302B comprises the same material as layer 304B. Like in barrier region 304, in a preferred embodiment, thicknesses of layers 303A and 302B are optimized to make it optically transparent beyond a specified wavelength (e.g., 2.5 µm for MWIR sensing) while maximizing minority carrier transport. This yields a different combination of thicknesses for layers 302A and 302B than layers 304A and 304B in the barrier region 304.

As mentioned above, contact regions 302 and 308 may, in one embodiment, have the same ALM-T2SL structure. In that embodiment, the above description of layers 304A and 304B is equally applicable to layers 308A and 308B. Thus, for brevity purposes only, a repetitive description of layers 308A and 308B is omitted here.

As discussed above, the materials used in the barrier region 304 and the contact regions 302 and 308, depend upon the material used in the absorber region 306. As such, attention will now be directed to the absorber region 306.

In the preferred embodiment, the absorber region is composed of the ternary alloy system, $InAs(1-x)Sb(x)$, where x represents the Sb alloy composition and controls the bandgap and lattice constant. $InAs(1-x)Sb(x)$ has several advantages over other materials when used as an absorber in large format sensor arrays for MWIR and LWIR detectors. $InAs(1-x)Sb(x)$ has strong optical absorption and a bandgap that can be adjusted to cover much of the MWIR to LWIR by varying the Sb composition fraction x from 0 to 60%. $InAs(1-x)Sb(x)$ also has much better minority carrier transport than III-V based superlattices. The alloy composition with 9% Sb is lattice matched to GaSb and has a bandgap of about 4 µm at 150K. It is also possible to make longer cutoff wavelength nBn-detectors using compositions of InAsSb with higher % Sb, by using metamorphic growth techniques to grow a buffer layer on top of the GaSb substrate with the required larger lattice constant. Metamorphic growth is required in order to access the full range of x-values and wavelengths, in which a "virtual" substrate having a lattice constant of the target Sb-alloy composition is produced.

Other embodiments include an absorber region 306 composed of: InAs/InAsSb, InAs/Ga(In)Sb, and other T2SL designs; a "W-structured" type-II superlattices with 4-layer and 5-layer period structure such as AlSb/InAs/InGaSb/InAs and AlSb/AlAs/InAs/InAsSb/InAs.

In the preferred embodiment in which the absorber region 306 is composed of bulk InAs(1−x)Sb(x), the selection of the Sb concentration in the absorber region 306 will determine the composition of the layers used for the ALM-T2SLs used in the contact 302, 308 and barrier 304 layers.

Table 1 below lists exemplary materials for h-well layers 302B, 304B, and 308B for different InAs(1−x)Sb(x) alloys used in the absorber region 306. Table 1 also shows the lattice constant range for the materials used in layers 302B, 304B and 308B.

| % Sb in Absorber Region 306 | Materials for Layers 302B, 304 and 308B | Lattice Constant Range |
|---|---|---|
| 0-18% | AlAs(x)Sb(1 − x), where % As: 0 to 8%. | 6.0959-6.1355 Å |
| 18% | AlSb | 6.1355 Å |
| 18-60% | Al(1 − x)In(x)Sb, where % In: 0 to 51% | 6.1355-6.3110 Å |

Figure 4:
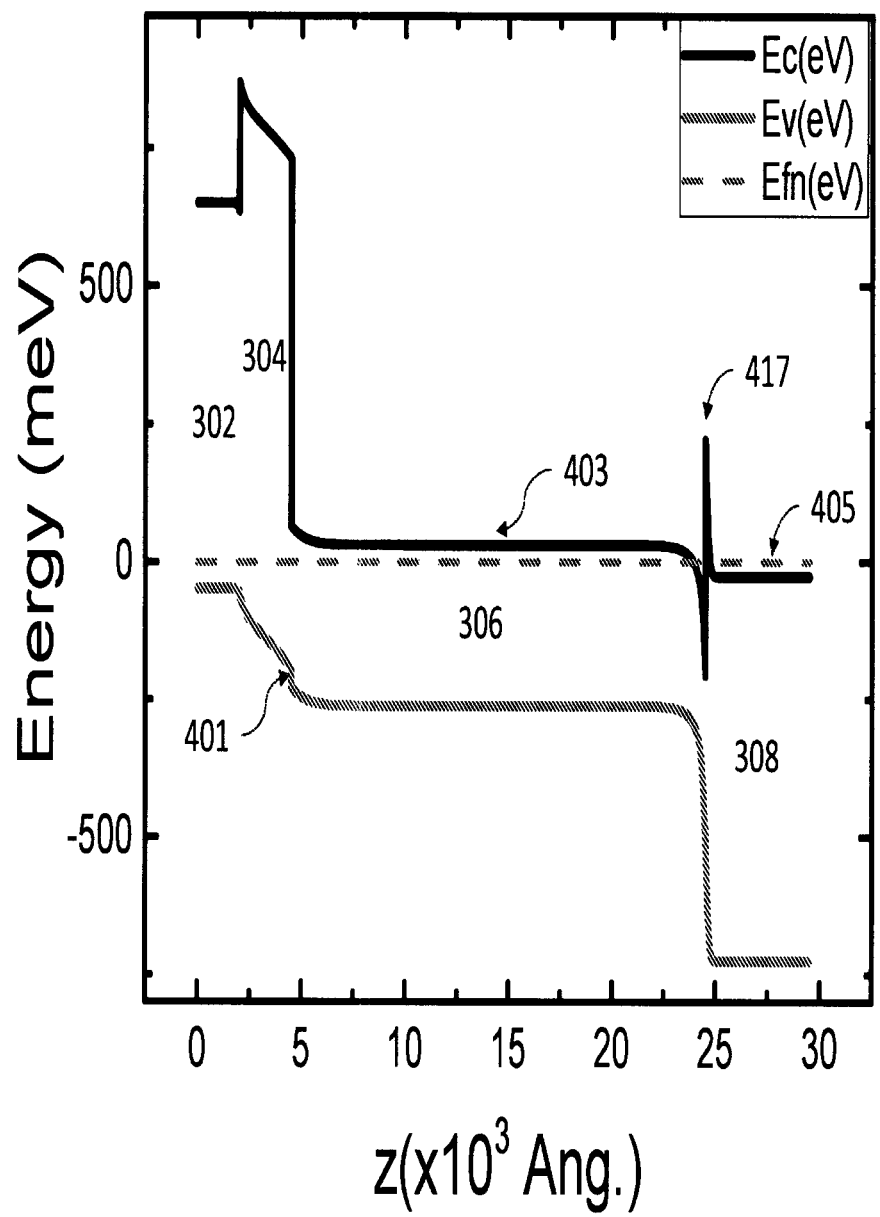
FIG. 4 is a simulated band diagram of detector 300.

FIG. 4 is a simulation of the band diagram corresponding to an embodiment of detector 300 with absorber region 406 comprised of $InAs_{0.91}Sb_{0.09}$ using an ALM-T2SL design that is lattice matched to GaSb. The e-wells (layers 302A, 304A, and 308A) in the contact regions 402 and 408, and barrier region 404 are also comprised of $InAs_{0.91}Sb_{0.09}$, while the h-wells (layers 302B, 304B, and 308B) are comprised of $AlAs_{0.8}Sb_{0.92}$, which is also lattice matched to GaSb.

The valence band 401, conduction band 403, and Fermi energy level 405 are shown in FIG. 4. In the embodiment represented in FIG. 4, contact region 302 is a p-type material with a doping concentration of $2.0 \times 10^{17}/cm^3$, barrier region 304 is a p-type material with a low doping concentration of $1.0 \times 10^{15}/cm^3$, the absorber region 306 is n-type material with moderate doping concentration of $5.0 \times 10^{15}/cm^3$, and the contact region 308 is heavily n-type with a doping concentration of $5.0 \times 10^{17}/cm^3$.

For one embodiment, Table 2 below provides the layer composition and thicknesses in monolayers/period (MLs/per.) for each period, the number of period repeats and the total thickness of each region in Å for the simulation of detector 300 shown in FIG. 4. One of ordinary skill, however, will recognize that these numbers are merely exemplary and may be varied to a degree without substantively changing the performance of detector 300.

| | Top Contact | Barrier | Absorber | Bot. Contact |
|---|---|---|---|---|
| MLs/per. InAs(91%)Sb(9%) | 7 | 3.5 | 6562 | 7 |
| MLs/per. AlAs(8%)Sb(92%) | 3 | 2.5 | 0 | 3 |
| Total MLs/per. | 10 | 6 | 6562 | 10 |
| Repeats | 66 | 137 | 1 | 164 |
| Thickness (Å) | 2000 | 2500 | 20000 | 5000 |

In correspondence with Table 2 and FIG. 4, each period of contact region 302 has a 7 ML for layer 302A and a 3 ML for layer 302B for a total period of 10 ML or about 30.5 Å. For 66 repeats of this period structure, the total top contact region 302 is approximately 2000 Å thick. With respect to contact region 308, in one embodiment, layer 308A also has 7 ML and layer 308B has 3 ML for a total period of 10 ML or about 30.5 Å. Unlike contact region 302, however, this period structure has 164 repeats for a total thickness of 5000 Å. Barrier region 304 has a thinner period structure with 3.5 ML for layer 304A and 2.5 ML for layer 304B for a total period of 6 ML or about 18.3 Å. This is repeated 137 time for a total barrier region 304 thickness of 2500 Å. The absorber region 306, in this embodiment too, comprises an $InAs_{0.91}Sb_{0.09}$ layer, 20,000 Å thick. It should be evident, however, to one skilled in the art that the thickness of these regions may be varied over a wide range for other embodiments, particularly the thicknesses of the contacts and absorber.

As can be seen in FIG. 4, there is a sharp increase in the conduction band 403 energy at the interface between the absorber region 306 and the barrier region 304, so that a substantial amount of energy would be required for an electron to cross from the absorber region 306 to contact region 302 over the barrier region 304. This renders barrier region 304 an effective means for blocking the migration of electrons from the absorber region 306.

Turning to the valence band 401, it is self-evident form FIG. 4 that there is no significant barrier to the migrations of holes at either the interface between the absorber region 306 and the barrier region 304 or the barrier region 304 and the contact region 302. Thus, a hole that is generated in the absorber region 306 may easily migrate towards contact region 302. This is largely due to the improved valence band alignment with the absorber region 306 afforded by using ALM-T2SLs for contact region 302 and barrier region 304 in comparison to bulk alloys or prior-art superlattices. Finally, the bandgaps (that is the difference in energy levels between the conduction band and the valence band) in the contact regions 302 and 308 are much larger than that of the absorber region, which reduces parasitic optical absorption in the contacts and also unwanted dark current due to thermal generation.

FIG. 4 shows an abrupt discontinuity 417 in the conduction band 403 at the interface between the contact region 308 and absorber region 306. This arises from the large conduction band offset of the ALM-T2SL used for the contacts with respect to the absorber region 306. Due to heavy n+ doping in the bottom, contact, however, discontinuity 417 is spike-like and very thin, so that it is effectively transparent to electron tunneling, and so does not impede electron transport to the "+" electrode 307-B. One of the advantages of using contact region 408 is that it provides lattice matching, has IR transparency, and does not degrade electron transport, and there is no lattice matched material with similar bandgap having no such conduction band discontinuity.

Figure 5:
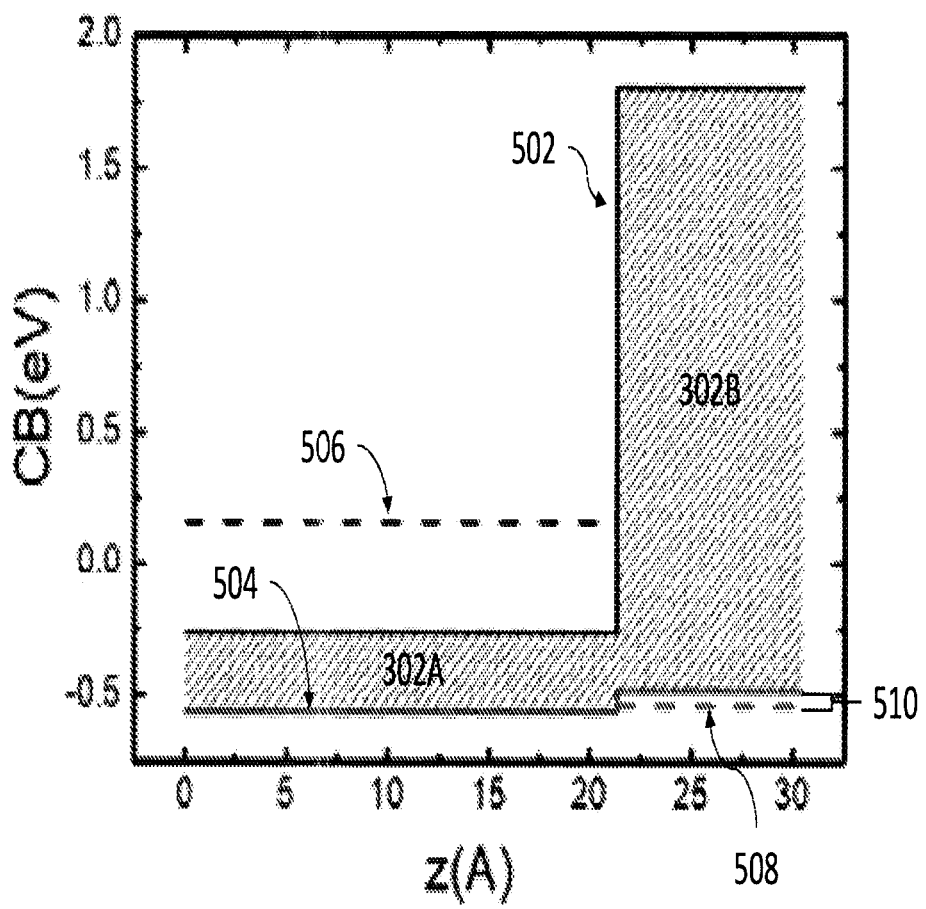
FIG. 5 is a band diagram of an interface between two layers of detector 300 according to one embodiment.

Having described the contact regions 302 and 308, barrier region 304, and absorber region 306, attention will now be directed to features of the layers forming contact region 302, as illustrated in in FIG. 5.

FIG. 5 is a band-edge energy plot for two exemplary layers 302A and 302B that form one period of the contact region 302, in an embodiment where the absorber region 306 comprises InAs(91%)Sb(9%) lattice matched to GaSb with about 4.2 μm bandgap at 200K. The e-well layer 302A is composed of 7 MLs of the same alloy, InAs(91%)Sb(9%), and the h-well layer 302B is composed of 3 MLs of AlAs(8%)Sb(92%) also lattice matched to the absorber region 308 and substrate 320. The hole well 510 is very shallow, with the first hole subband, 508, nearly aligned with the valence band of the bulk alloy used for e-well layer 302A and the absorber region 306 (InAs(91%)Sb(9%)). One of the advantages of this construction is that the holes are weakly confined and the valance band of the p+ contact region 302 maintains good alignment with that of the absorber region 306. The bandgap, given by the difference in energies between the first electron subband 506 and the first hole subband 508, is about 0.6 eV in this embodiment which is large relative to that of the absorber region 306. This is mainly due to strong confinement of electrons in the e-well layer 302A by the AlAsSb layer 302B. This arrangement provides good IR transparency.

Figure 6:
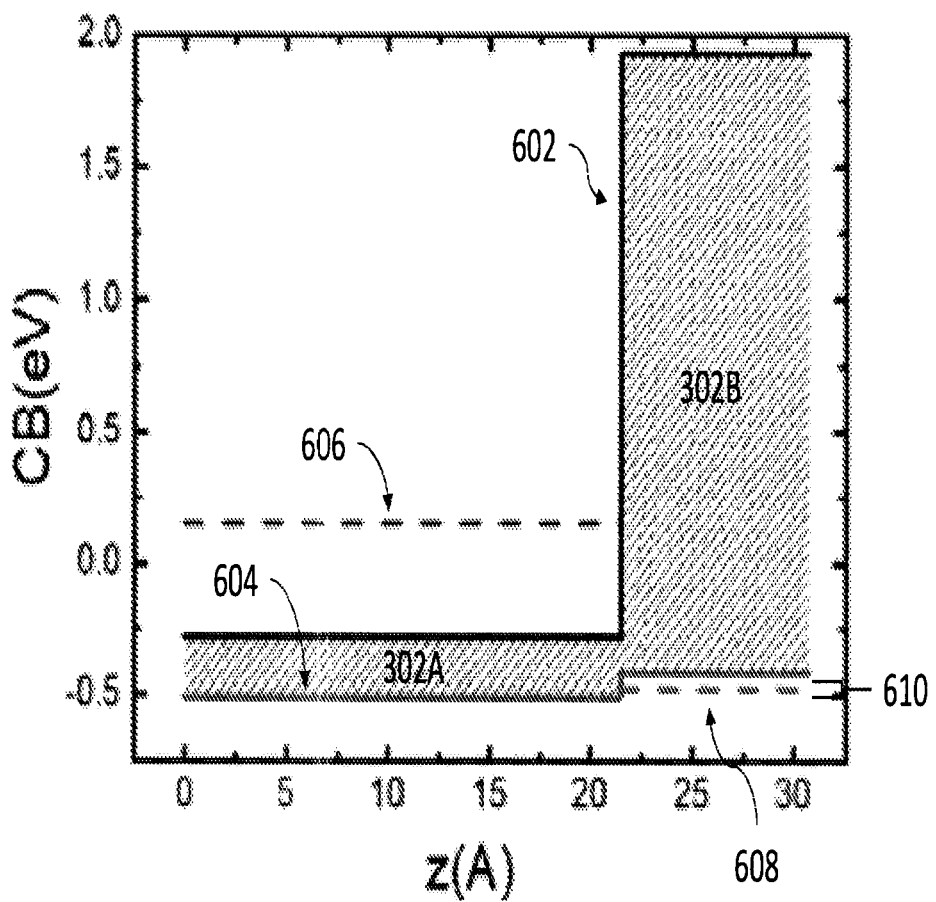
FIG. 6 is a band diagram of an interface between two layers of detector 300 according to another embodiment.

FIG. 6 is a band-edge energy plot for two exemplary layers 302A and 302B according to another embodiment. Layers 302A and 302B form one period of the contact region 302 where the absorber region 306 comprises InAs(82%) Sb(18%) with about 5.7 µm bandgap at 200K and a lattice constant of 6.135 Å, grown unstrained on a metamorphic buffer. The e-well layer 302A is again composed of 7 MLs of the same alloy InAs(82%)Sb(18%). The h-well layer 302B is composed of 3 MLs of AlSb that is lattice matched to the absorber region 306. Again the hole well 610 can be seen to be very shallow, with the first hole subband 608, nearly aligned with the valence band of the absorber region 306, and the energy gap relatively large, providing the desired transport and optical properties for the contact.

Figure 7:
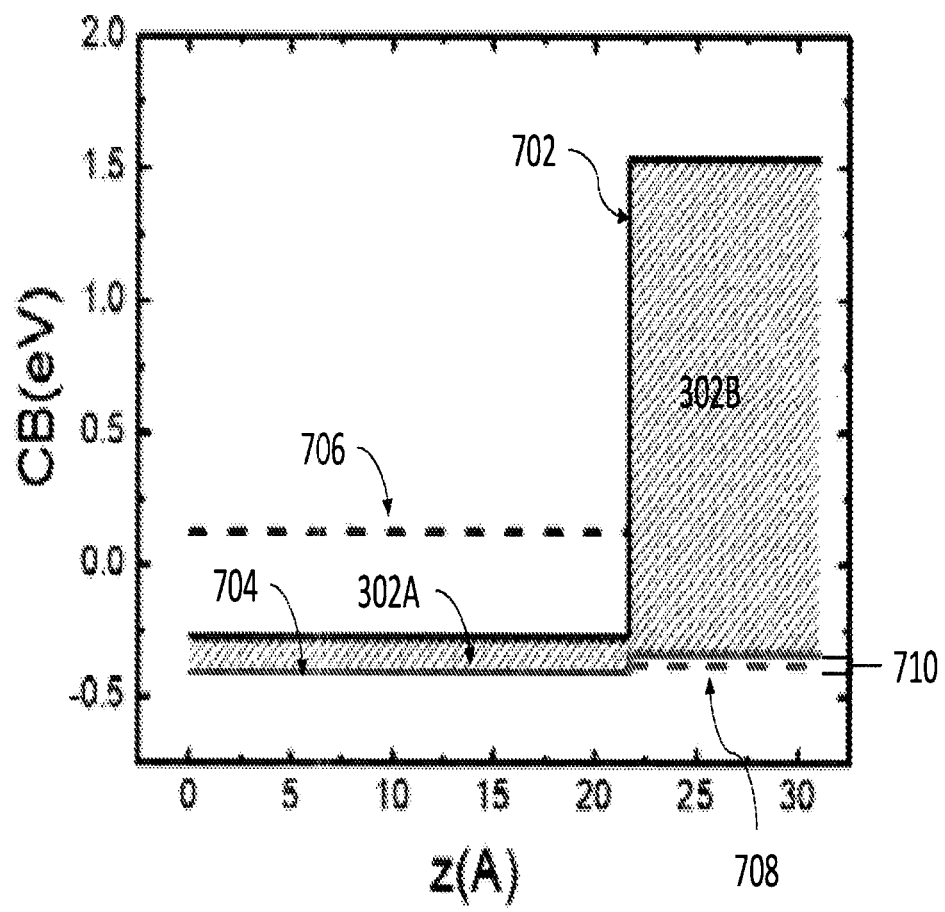
FIG. 7 is a band diagram of an interface between two layers of detector 300 according to yet another embodiment.

FIG. 7 is another band-edge energy plot for two exemplary layers 302A and 302B according to yet another embodiment. Layers 302A and 302B form one period of the contact region 302 where the absorber region 306 comprises InAs(66%)Sb(34%) with approximately 10 µm bandgap at 200K with 6.2015 Å lattice constant, and is grown unstrained on a metamorphic buffer. Similar to FIG. 6, the e-well layer 302A is again composed of 7 MLs of the same alloy used in the absorber region 306, InAs(66%)Sb(34%), while this time the h-well layer 302B is composed of 3 MLs of Al(81%)In(19%)Sb also lattice matched to the absorber region 306. Again the hole well 710 can be seen to be very shallow, with the first hole subband, 708, nearly aligned with the valence band of the absorber region 306, and the energy gap relatively large, providing the desired transport and optical properties for the contact.

One of the advantages of the disclosed detector is that because all the individual layers 302A and 302B of the ALM-T2SL are lattice matched to the material used in the absorber region 306, there is no need to strain balance the layers 302A and 302B by varying their respective thicknesses. Rather, the detector designer is free to choose any thicknesses of 302A, 302B to create the desired conduction and valence bands. This is also true for the layers comprising the barrier region 304 and n+ contact region 308 which, in the preferred embodiment, use the same materials in constructing ALM-T2SLs for these regions for a given absorber composition and lattice constant. This is illustrated in FIGS. 8, 9A, and 9B discussed below.

Figure 8:
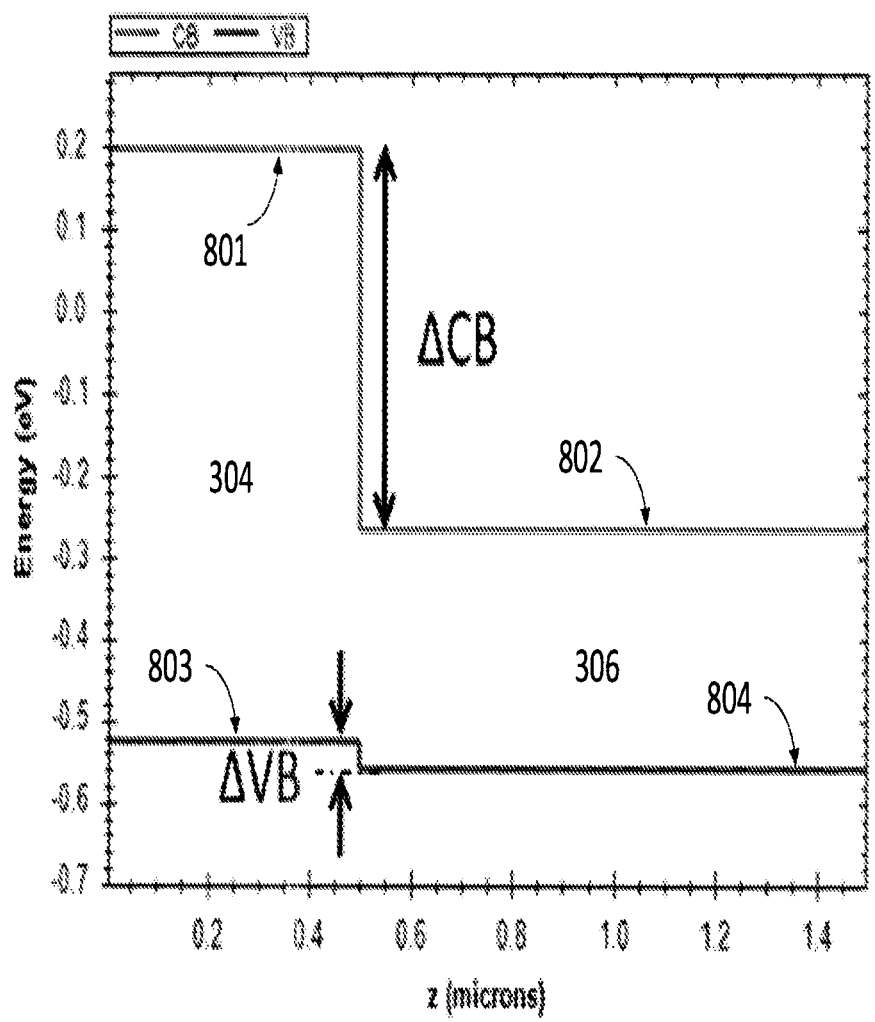
FIG. 8 is a band diagram illustrating the difference between conduction and valence bands of one embodiment of the absorber and barrier regions.
Figure 9A:
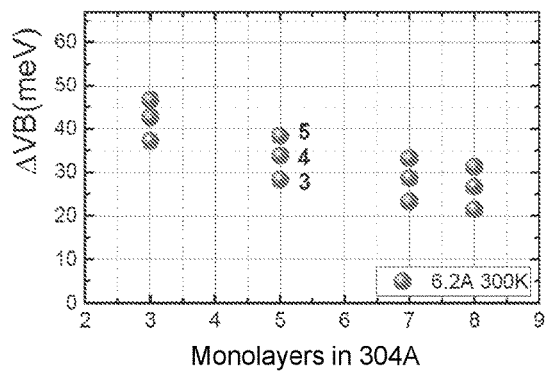
FIG. 9A is graph showing the difference in valence band energy of barrier layer ALM-T2SLs with respect to that of an InAs(66%)Sb(34%) absorber as a function of the number of monolayers forming layer 304A for a set number of monolayers forming layer 304B.
Figure 9B:
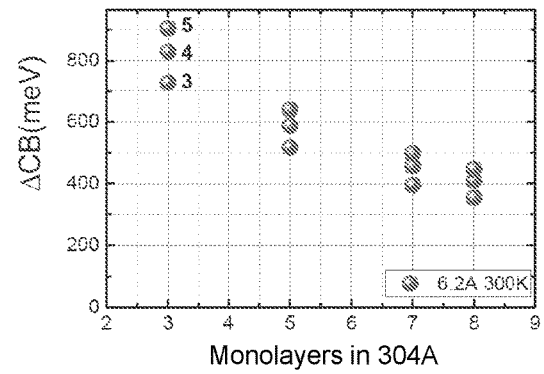
FIG. 9B is graph showing the difference in conduction band energy of barrier layer ALM-T2SLs with respect to that of an InAs(66%)Sb(34%) absorber as a function of the number of monolayers forming layer 304A for a set number of monolayers forming layer 304B.

FIG. 8 is an illustration of an interface between barrier region 304 and absorber region 306 and is provided to illustrate the definition of two terms: ACB and AVB. ACB is the difference between the energy of the conduction band 801 in barrier region 304 and the energy of the conduction band 802 in absorber region 306. AVB is the difference between the energy of the valence band 803 in the barrier region 304 and the energy of the valence band 804 in the absorber region 306. FIG. 9A is a plot of AVB vs monolayer thickness of layer 304A (the electron well in the barrier region 304) for three different monolayer thicknesses of layer 304B (the hole well in the barrier region 304), specifically 3, 4, and 5 monolayers. FIG. 9B is plot of ACB vs monolayer thickness of layer 304A (the electron well in the barrier region 304) for three different monolayer thicknesses of layer 304B (the hole well in the barrier region 304), again 3, 4, and 5 monolayers. As can be seen from FIG. 9A, AVB is small over the range shown, less than the average carrier thermal energy $1.5 k_b T \sim 39$ meV at 300K for barriers with 5 or more ML-thick e-wells, where $k_b$ is Boltzmann's constant. This can be decreased still further by adding additional monolayers to the electron well layer 304A. At the same time, ACB remains quite large as shown in FIG. 9B, where it can exceeds 600 meV for a design with a 5 ML e-well where $\Delta VB$ is less than $1.5 k_b T$. This means that one can use the ALM-T2SL approach to design barriers that can effectively block electrons, while not impeding minority holes as required for the XBn device structure. As one of ordinary skill will appreciate, FIGS. 9A and 9B only show four data points along the x-axis, however, layer 304A and 304B can be anywhere on a continuum of thicknesses over the ranges shown for these layers, and each may be made with thicknesses considerably beyond this range (1-70 ML) to construct ALM-T2SLs with other or additional design objectives.

Figure 10:
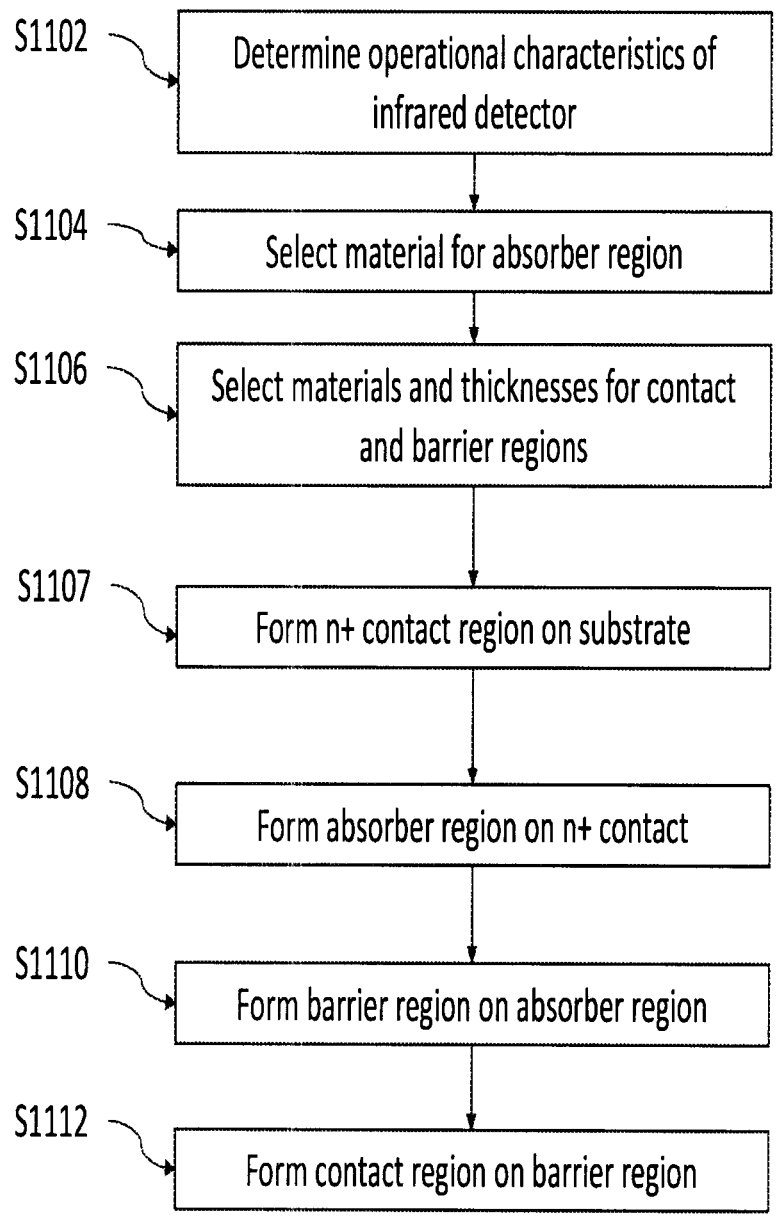
FIG. 10 is a flow chart illustrating a method of forming detector 300 according to one embodiment.

FIG. 10 is a flow chart illustrating how detector 300 is constructed according to one embodiment. First, in S1102, the operational characteristics of detector 300 are determined. Specifically, the wavelength range of infrared light that the detector 300 is intended to detect and the anticipated operational temperature of the detector 300 are determined. Next, in S1104, a material for the absorber region 306 is selected. The choice of material for the absorber region 306 depends on the operational characteristics of the detector 300 determined in S1102. As discussed above, the bandgap in a semiconductor material determines the wavelength range over which that material is responsive. As the bandgap of a semiconductor is also function of the temperature of the material, so it is important to select an appropriate material based on the operational characteristics of the detector 300. Once the material for the absorber region 306 is determined in S1104, the materials for the contact regions 302 and 308, and the barrier region 304 can be determined. Specifically, the materials for layers 302B, 308B, and 304B. As discussed above, in a preferred embodiment, the material for the e-well layers 302A, 308A and 304A are the same, or substantially the same, as material used in the absorber region 306. Materials for the h-well layers 302B, 308B, and 304B are selected such that their lattice constants also match, or substantially match, the lattice constant of the material used for absorber region 306 and the e-wells 302A, 308A, and 304A, such that when the regions are combined to form a detector 300, the regions are unstrained. Finally, the respective thicknesses of layers 302A, 302B, 308A, 308B, 304A, and 304B must be determined. Once again, these thicknesses are determined based on the desired operational characteristics of the detector 300. At a minimum, however, the thicknesses of layers 304A and 304B should be controlled such that there is a large difference between the energy level of the conduction band in barrier region 304 and the energy level of the conduction band in absorber region 306. In a preferred embodiment, the difference should be roughly greater than $10 k_b T$.

Now that the materials for the various regions have been determined based on the operational characteristics of the detector 300, the detector itself may be formed. In 51107, the n+ contact region 308 is formed on the underlying substrate using molecular beam epitaxial (MBE) growth or other epitaxial method such as metal-organic vapor deposition (MOCVD) to alternately deposit the materials and n-type dopants for layers 308A and 308B such that the n+ contact region 308 is formed layer-by-layer. The deposition process is controlled such that the desired monolayer thicknesses are obtained, and the overall thickness of the n+ contact region 308 is obtained. Next, in S1108, the absorber region 306 may be formed by MBE or MOCVD growth of the precise InAs(1−x)Sb(x) alloy, with or without moderate n-doping, layer by layer to the desired thickness of the absorber 306. Next, in S1110, the barrier region 304 may be formed on the underlying absorber region 306 using MBE or MOCVD to alternatingly deposit the materials and possibly p-type dopants for layers 304A and 304B such that the barrier region 304 is formed layer-by-layer. The deposition process is controlled such that the desired monolayer thicknesses are obtained, and the overall thickness of the barrier region 304 is obtained. In an alternative embodiment, the barrier region 304 may be deposited before the absorber region 306 using the techniques described above, such that regions 304 and 306 are flipped from what is shown in FIG. 3A. Next, in S1112, the contact region 302 is formed on the barrier region 304 by the same process, that is by alternatingly depositing the materials and dopants for layers 302A and 302B (e.g., p+ dopants). Once again, the deposition process is controlled such that the desired monolayer thicknesses are obtained and the overall thickness of the contact region 302 is obtained. Once the contact region 302 is formed, standard semiconductor device fabrication techniques may be used to define individual devices (pixels) by etching down to the N+ contact 308 followed by the patterned deposition of Ohmic contact metallization. The devices may then be electrically connected to read-out circuitry that, under the control of a computer or controller, collects the photocurrent generated in each device under IR excitation under appropriate biasing at desired time intervals. As the photocurrent is collected for a specified time, charge accumulates in storage capacitor or other structure, proportional to the IR flux incident on the individual device during the specific time interval. The accumulated charge thus represents an analog signal that may be converted to a digital signal by an analog to digital converter and provided to the computer or controller which, in turn, transforms the digital signal into a viewable image or other result.

While various example embodiments of the invention have been described above, it should be understood that they have been presented by way of example, and not limitation. It is apparent to persons skilled in the relevant art(s) that various changes in form and detail can be made therein. Thus, the disclosure should not be limited by any of the above described example embodiments, but should be defined only in accordance with the following claims and their equivalents.

In addition, it should be understood that the figures are presented for example purposes only. The architecture of the example embodiments presented herein is sufficiently flexible and configurable, such that it may be utilized and navigated in ways other than that shown in the accompanying figures.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the example embodiments presented herein in any way. It is also to be understood that the procedures recited in the claims need not be performed in the order presented.

What is claimed is:

1. An infrared detector, comprising:
    an absorber region formed from a first semiconductor material with a first lattice constant, wherein the first semiconductor material produces charge carriers in response to infrared light, and wherein the first semiconductor material is a ternary alloy of the form $AB_{1-x}C_x$, where A is a first material, B is a second material, and C is a third material;
    a barrier region disposed on the absorber region, wherein the barrier region is a superlattice comprising: (i) a plurality of first barrier region layers comprising the first semiconductor material, and (ii) a plurality of second barrier region layers comprising a second semiconductor material that is different from the first semiconductor material, wherein the plurality of first barrier region layers are alternatingly arranged with the plurality of second barrier region layers; and
    a contact region disposed on the barrier region, wherein the contact region is another superlattice comprising: (i) a plurality of first contact region layers comprising the first semiconductor material, and (ii) a plurality of second contact region layers comprising the second semiconductor material, wherein the plurality of first contact region layers are alternatingly arranged with the plurality of second contact region layers,
    wherein the second semiconductor material is lattice matched to the first semiconductor material resulting in the absorber region, the barrier region, and the contact region being unstrained.

2. The detector according to claim 1, wherein an energy level of a conduction band corresponding to the barrier region is greater than an energy level of a conduction band corresponding to the absorber region such that a negative charge carrier generated in the absorber region in response to infrared light is prevented from migrating into the barrier region.

3. The detector according to claim 1, wherein an energy level of a valence band corresponding to the barrier region is greater than an energy level of a valence band corresponding to the absorber region such that a positive charge carrier generated in response to infrared light is able to migrate across the barrier region into the contact region.

4. The detector according to claim 1, wherein the contact region is an n-type region and the absorber region is an n-type region.

5. The detector according to claim 1, wherein the contact region is a p-type region and the absorber region is an n-type region.

6. The detector according to claim 1, wherein a thickness of a first barrier region layer is greater than a thickness of a second barrier region layer.

7. The detector according to claim 1, wherein a thickness of a first contact region layer is greater than a thickness of a second contact region layer.

8. The detector according to claim 1, wherein a thickness of a first barrier region layer is different from a thickness of a first contact region layer.

9. The detector according to claim 1, wherein the absorber region, the plurality of first barrier region layers, and the plurality of first contact region layers comprise $InAs_{(1-x)}Sb_{(x)}$, and the plurality of second barrier region layers and the plurality of second contact region layers comprise AlAsSb.

10. The detector according to claim 9, wherein the $InAs_{(1-x)}Sb_{(x)}$ is $InAs_{0.91}Sb_{0.8}$ and the AlAsSb is $AlAs_{0.8}Sb_{0.92}$.

11. The detector according to claim 1, wherein the absorber region, the plurality of first barrier region layers, and the plurality of first contact region layers comprise $InAs_{(1-x)}Sb_{(x)}$, and the plurality of second barrier region layers and the plurality of second contact region layers comprise AlSb.

12. The detector according to claim 11, wherein the $InAs_{(1-x)}Sb_{(x)}$ is $InAs_{0.82}Sb_{0.18}$.

13. The detector according to claim 1, wherein the absorber region, the plurality of first barrier region layers, and the plurality of first contact region layers comprise $InAs_{(1-x)}Sb_{(x)}$, and the plurality of second barrier region layers and the plurality of second contact region layers comprise AlInSb.

14. The detector according to claim 13, wherein the $InAs_{(1-x)}Sb_{(x)}$ is $InAs_{0.66}Sb_{0.34}$ and the AlAsSb is $Al_{0.81}In_{0.19}Sb$.

15. The detector according to claim 1, further comprising:
a second contact region adjacent to the absorber region, wherein the second contact region is a superlattice comprising: (i) a plurality of third contact region layers comprising the first semiconductor material, and (ii) a plurality of fourth contact region layers comprising the second semiconductor material,
wherein the plurality of third contact region layers are alternatingly arranged with the plurality of fourth contact region layers.

16. A method of forming an infrared detector, comprising:
forming an absorber region from a first semiconductor material with a first lattice constant on a substrate, wherein the first semiconductor material produces charge carriers in response to infrared light, and wherein the first semiconductor material is a ternary alloy of the form $AB_{1-x}C_x$, where A is a first material, B is a second material, and C is a third material;
forming a barrier region on the absorber region, wherein the barrier region is a superlattice comprising: (i) a plurality of first barrier region layers comprising the first semiconductor material, and (ii) a plurality of second barrier region layers comprising a second semiconductor material that is different from the first semiconductor material, wherein the plurality of first barrier region layers are alternatingly arranged with the plurality of second barrier region layers; and
forming a contact region on the barrier region, wherein the contact region is another superlattice comprising: (i) a plurality of first contact region layers comprising the first semiconductor material, and (ii) a plurality of second contact region layers comprising the second semiconductor material, wherein the plurality of first contact region layers are alternatingly arranged with the plurality of second contact region layers,
wherein the second semiconductor material is lattice matched to the first semiconductor material resulting in the absorber region, the barrier region, and the contact region being unstrained.

17. The method of claim 16, wherein an energy level of a conduction band corresponding to the barrier region is greater than an energy level of a conduction band corresponding to the absorber region such that a negative charge carrier generated in the absorber region in response to infrared light is prevented from migrating into the barrier region.

18. The method of claim 16, wherein the contact region is an n-type region and the absorber region is an n-type region.

19. The method of claim 16, wherein the contact region is a p-type region and the absorber region is an n-type region.

20. The method of claim 16, further comprising:
forming a second contact region adjacent to the absorber region, wherein the second contact region is a superlattice comprising: (i) a plurality of third contact region layers comprising the first semiconductor material, and (ii) a plurality of fourth contact region layers comprising the second semiconductor material,
wherein the plurality of third contact region layers are alternatingly arranged with the plurality of fourth contact region layers.

\* \* \* \* \*